US009431140B2

(12) United States Patent
Mok

(10) Patent No.: US 9,431,140 B2
(45) Date of Patent: Aug. 30, 2016

(54) OPTIMIZED MULTI-PINHOLE COLLIMATOR FOR DUAL-PURPOSE CLINICAL AND PRECLINICAL IMAGING

(71) Applicant: UNIVERSITY OF MACAU, Taipa, Macau (CN)

(72) Inventor: Seng Peng Mok, Macau (CN)

(73) Assignee: UNIVERSITY OF MACAU, Taipa, Macau (CN)

( * ) Notice: Subject to any disclaimer, the term of this patent is extended or adjusted under 35 U.S.C. 154(b) by 182 days.

(21) Appl. No.: 14/057,229

(22) Filed: Oct. 18, 2013

(65) Prior Publication Data

US 2015/0108374 A1 Apr. 23, 2015

(51) Int. Cl.
*G01T 1/161* (2006.01)
*G21K 1/02* (2006.01)
*G06F 17/50* (2006.01)
*G01T 1/164* (2006.01)

(52) U.S. Cl.
CPC ............ *G21K 1/025* (2013.01); *G01T 1/1648* (2013.01); *G06F 17/50* (2013.01)

(58) Field of Classification Search
CPC .... G01T 1/1648; A61B 6/037; G21K 1/025; G21K 2207/00; G06F 17/50
See application file for complete search history.

(56) References Cited

PUBLICATIONS

"Design of an Optimized Multi-Pinhole Collimator for Dual-purpose Clinical and Preclinical Imaging", IEEE Nuclear Science Symposium and Medical Imaging Conference, Fall 2012, pp. 3189-3191 to Si et al.*
"Design and Development of a Multi-Pinhole Collimator for High-Resolution and Highefficiency SPECT Imaging of Atherosclerotic Plaques in APOE-/- Mice" Dissertation submitted to Johns Hopkins University, Jan. 2009, p. 1-152 to Mok.*
Ching-Hong Si, et al., "Design of an Optimized Multi-Pinhole Collimator for Dual-purpose Clinical and Preclinical Imaging", J Nucl Med., vol. 51, 3 pages, 2010.
Nillius, P., et al., "Theoretical Bounds and System Design for Multipinhole SPECT", IEEE Transactions on Medical Imaging, vol. 29, No. 7, p. 1390-1400, (Jul. 2010).
M C M Rentmeester, van der Have, et al., "Optimizing multi-pinhole SPECT geometries using an analytical model", Phys. Med. Biol., vol. 52, p. 2567-2581, (2007).

* cited by examiner

*Primary Examiner* — David J Makiya
*Assistant Examiner* — Kenneth J Malkowski
(74) *Attorney, Agent, or Firm* — Nath, Goldberg & Meyer; Jerald L. Meyer; Stanley N. Protigal

(57) ABSTRACT

A multi-pinhole collimator is formed by calculating a projection size (D) for different pinhole numbers (n) for a predetermined field-of-view (FOV) (d) by arranging a plurality of projections into a pattern. A pattern is selected which utilizes a whole detector with maximized packing density, minimum truncation to provide a projection overlap below a predetermined limit. The number of pinholes is modified to calculate a collimator length, a corresponding acceptance angle and aperture size. Sensitivities for individual pinholes are added to obtain a total sensitivity for a given pinhole number, and an optimized multi-pinhole configuration is obtained by maximizing the total sensitivity for a predetermined target resolution ($R_t$) and field-of-view (FOV) (d).

8 Claims, 5 Drawing Sheets

OPTIMIZED MULTI-PINHOLE COLLIMATOR FOR DUAL-PURPOSE CLINICAL AND PRECLINICAL IMAGING

BACKGROUND

1. Field

The present disclosure relates to an adaptive pinhole single photon emission computed tomography (SPECT or SPET) which provides superior spatial resolution and detection efficiency trade-off as compared to a conventional parallel-hole collimator for imaging small field-of-view (FOV).

2. Background

Single photon emission computed tomography (SPECT) is a nuclear medicine tomographic imaging technique using gamma rays. Previously an adaptive multi-pinhole (MPH) collimator for clinical myocardial perfusion imaging (MPI) and small animal imaging (SAI) of rats was developed. The MPH collimator was based on a dual-head clinical SPECT/CT system, as described in G. S. P. Mok, B. M. W. Tsui, Y. X. Wang, F. P. T. Choi, G. Yip and A. Ahuja, "Design of a multi-pinhole collimator for high performance clinical and preclinical molecular imaging," J Nucl Med., vol. 51, p. 1393, 2010.

The design of MPH collimator depends on specific detection efficiency and resolution requirements for different imaging applications. In order to determine the optimal MPH collimator design, P. Nillius and M. Danielsson, "Theoretical Bounds and System Design for Multipinhole SPECT," IEEE Trans. Med. Imag., vol. 29, pp. 1390-1400, July 2010, proposed an analytical model and showed that the image quality in terms of resolution and detection efficiency are related to several parameters: the diameter of FOV (d), radii-of-rotation (l), collimator length (L–l), detector intrinsic resolution ($R_i$) and the size of the active detector area (A). Those MPH collimator configuration parameters can be determined for a given system resolution ($R_t$) and FOV (d) in order to optimize the detection efficiency (S). On the other hand, M. C. M. Rentmeester, van der Have, F., Beekman, F. J., "Optimizing multi-pinhole SPECT geometries using an analytical model," Phys Med Biol, vol. 52, pp. 2567-2581, May 7, 2007, developed a continuous analytical model for optimizing the MPH SPECT geometries and they suggested that the pinhole apertures should be placed as close as possible to the object, i.e., minimizing the imaging distance, in order to optimize the resolution-detection efficiency trade-off.

SUMMARY

A multi-pinhole collimator is formed by calculating a projection size (D) for different pinhole numbers (n) for a predetermined field-of-view (FOV) (d) by arranging a plurality of projections into a pattern. A configuration of a pattern is selected to utilize a whole detector with maximized packing density, minimum truncation to provide a projection overlap below a predetermined limit. A number of pinholes to calculate a collimator length is modified, and an acceptance angle and aperture size is calculated. The sensitivities for individual pinholes are added to obtain a total sensitivity for a given pinhole number. An optimized multi-pinhole configuration is pursued by maximizing the total sensitivity for a predetermined target resolution ($R_t$) and field-of-view (FOV) (d).

BRIEF DESCRIPTION OF THE DRAWINGS

FIG. 2A is a pattern for an MPI collimator and FIG. 2B is a sampled projection image generated using an 11-pinhole MPI collimator for a spherical phantom with FOV of 20 cm. FIG. 2C is a pattern for an SAI collimator and FIG. 2D is a sampled projection imaged generated using a 4-pinhole SAI collimator for a spherical phantom with FOV of 5 cm.

DETAILED DESCRIPTION

Overview

Figure 1A:
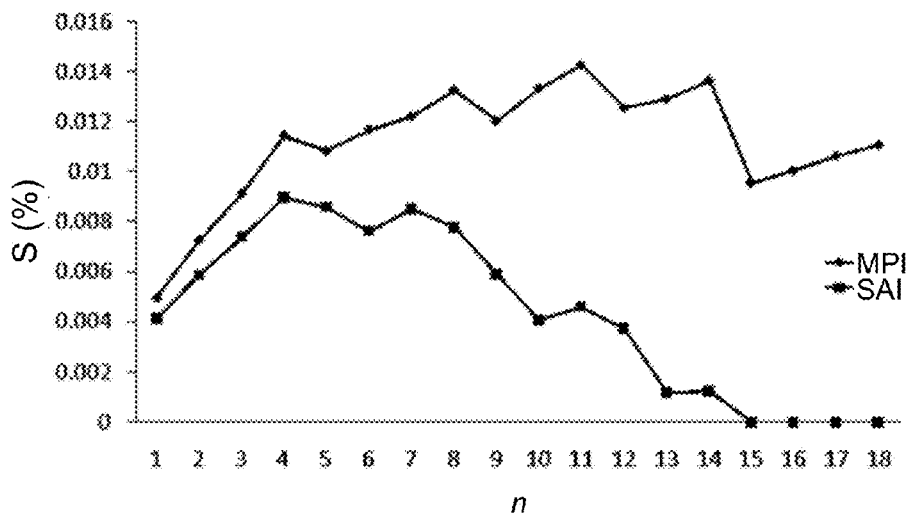
FIGS. 1A and 1B are graphs showing total sensitivity ($S_n$) plotted as a function of the number of pinholes n for MPI and SAI modes (FIG. 1A), and showing corresponding collimator length ($L_n$–l) plotted as a function of the number of pinholes n (FIG. 1B).

Pinhole single-photon emission computed tomography (SPECT) provides superior trade-off between resolution and detection efficiency as compared to conventional parallel-hole collimator for imaging small field-of-view (FOV). The present disclosure provides a technique to optimize an adaptive multi-pinhole (MPH) collimator design for two specific applications.

Examples

For clinical myocardial perfusion imaging (MPI) and small animal imaging (SAI), the target resolutions are set to 1 cm and 1.5 mm, the FOVs were 20 cm and 5 cm, and the radii-of-rotation were 22 cm and 5 cm, respectively. The maximum detector-to-detector distance for the scanner was 76 cm. The detection efficiency is optimized and the design parameters are calculated as follows: (i) MPI: 11 pinholes with 3.42 mm aperture size, 14.5 cm collimator length; (ii) SAI: 4 pinholes with aperture size of 0.93 mm, 20.8 cm collimator length. All pinholes are knife-edge and focused to the center of FOV.

The collimator is composed of two parts: a base cone with a height of 14.5 cm for MPI and an auxiliary cone with a height of 6.3 cm that can be combined with the base cone for SAI. The pinholes are placed in a way to utilize the whole detector, minimize projection truncation and keep the projection overlapping (multiplexing) <20%. Tc-99m point source simulations, using GATE (Geant4 Application for Emission Tomography) were performed for different imaging distances to compare the detection efficiency and resolution between low-energy-high-resolution (LEHR) parallel-hole and MPH collimator. For MPI, the measured FWHMs were 10.70 mm and 8.24 mm for LEHR and MPH respectively, while the detection efficiency of MPH had 60.7% improvement as compared to LEHR. For SAI, the FWHMs for LEHR and MPH were 4.92 mm and 1.05 mm respectively. The new collimator has improved the imaging performance as compared to a previous design. It provides a significant improvement in resolution and detection efficiency trade-off as compared to current MPI using LEHR with extra capability for SAI. The present system optimizes the collimator design based on a theoretical calculation and we demonstrated its imaging performance, i.e., spatial resolution and detection efficiency using Monte Carlo simulations (GATE).

The minimal radii-of-rotation (l) for the patient and the rat, i.e., ~22 cm and ~5 cm, were used in this study. In one non-limiting example, the system resolution ($R_t$) and FOV (d) were presumed to be 1 cm/1.5 mm for humans and 20 cm/5 cm for rats. Based on the analytical model proposed by Nillius et al. and the physical limits of the GE Infinia II 3/8 Hawkeye scanner with the maximum detector-to-detector distance ($2L_{max}$) of ~76 cm, the adaptive clinical and pre-clinical MPH design was optimized by 4 major steps for different pinhole numbers (n=1-18):

Step 1: Calculate the projection size (D) by arranging the projections, i.e., equivalent to changing the pinhole pattern, to utilize the whole detector with maximized packing density, minimum truncation and <20% projection overlapping (multiplexing) for the pre-determined d and $R_t$;

Step 2: Modify n, thus $D_n$, to calculate the associate $L_n-l$ (collimator length).

$$L_n - l = \frac{D_n}{d}\sqrt{l^2 - \frac{d^2}{4}}, n = 1, 2, 3 \quad \text{(equation 1)}$$

Step 3: Calculate the acceptance angle ($\alpha_n$) and aperture size ($a_n$) in equations (2) and (3).

$$\alpha_n = 2\sin^{-1}(d/2l) \quad \text{(equation 2)}$$

$$a_n = \sqrt{R_t^2 - R_i^2 \frac{l^2}{(L_n-l)^2}} \frac{L_n-l}{L_n} - \frac{\ln 2}{\mu}\tan\frac{\alpha_n}{2} \quad \text{(equation 3)}$$

Step 4: Add up sensitivity for individual pinhole i ($S_i$) to get the total sensitivity $S_n$ for a given pinhole number from equation (4).

$$S_n = \sum_{i=1}^{n} S_i$$

$$= \sum_{i=1}^{n} \frac{a_n^2 + \frac{2}{\mu}a_n\tan\frac{\alpha_n}{2} + \frac{2}{\mu^2}\tan^2\frac{\alpha_n}{2}}{16l^2}\sin^3\theta_i \quad \text{(equation 4)}$$

Where $R_i$ is the detector intrinsic resolution which is 3.2 mm for the GE Infinia II 3/8 Hawkeye scanner $\theta_i$ is the incidence angle of the pinholes, $L_n$ is the detector to axis-of-rotation distance, $\mu$ is the attenuation coefficient of the aperture material which equals to 36.4 cm$^{-1}$ for tungsten at 140 keV.

All pinholes were knife edge design and made with tungsten. They are tilted towards the center of FOV (CFOV) to maximize the detection efficiency.

Monte Carlo simulations of a Tc-99m point source were performed using GATE (Geant4 Application for Emission Tomography). The projection data for the MPI-MPH collimator and SAI-MPH collimator were compared with the conventional LEHR collimator and General Purpose Pin Hole (GPPH) collimator with 2 mm hole diameter in different imaging distances in terms of spatial resolution; i.e., full-width-at-half-maxima (FWHM) and detection efficiency drop-off.

Figure 1B:
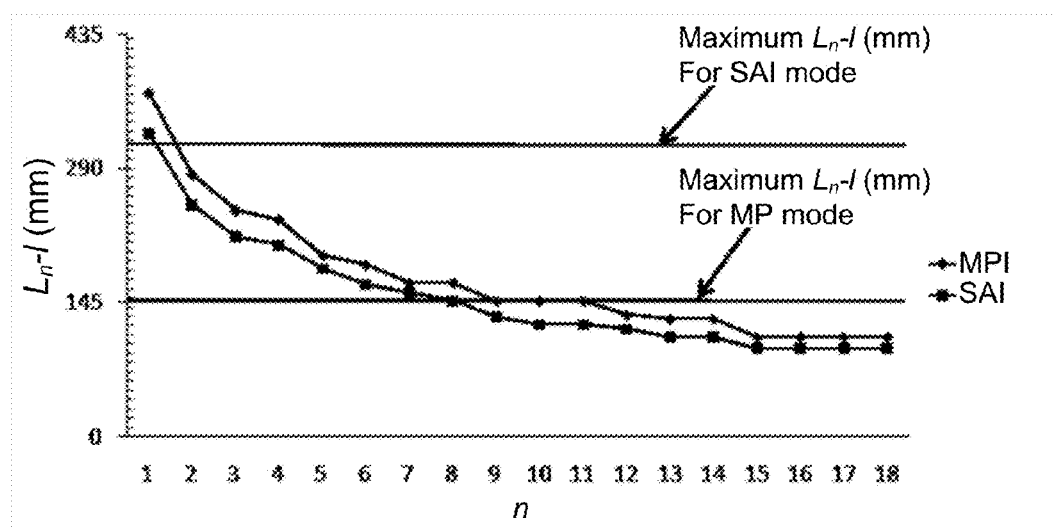

FIGS. 1A and 1B are graphs showing total sensitivity ($S_n$) plotted as a function of n for MPI and SAI modes (FIG. 1A), and showing corresponding collimator length ($L_n-l$) plotted as a function of the number of pinholes n (FIG. 1B). FIGS. 1A and 1B show the optimization results for MPI and SAI, respectively. The maximum collimator lengths are 14.5 cm and 31.5 cm for MPI and SAI respectively. The projection size (D) is calculated by arranging the projections, which is equivalent to changing the pinhole pattern, to utilize the whole detector with maximized packing density, minimum truncation and <20% projection overlapping (multiplexing) for the pre-determined d and $R_t$.

Figure 2A:
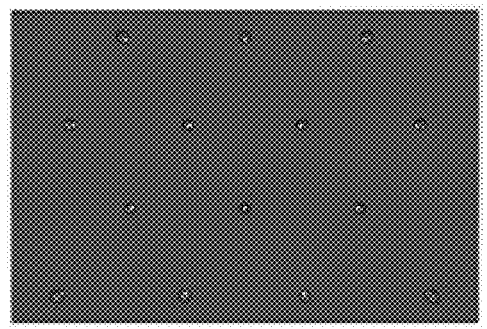
FIGS. 2A-2D are patterns and sampled projection images corresponding to an MPI collimator for a spherical phantom (FIGS. 2A and 2B), and an SAI collimator for a spherical phantom (FIGS. 2C and 2D).
Figure 2B:
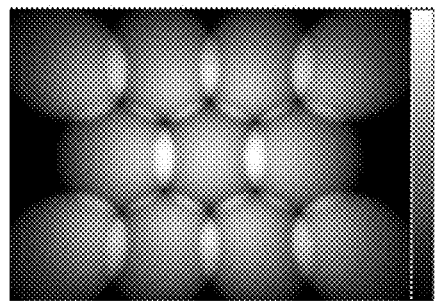
Figure 2C:
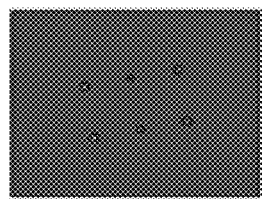
Figure 2D:
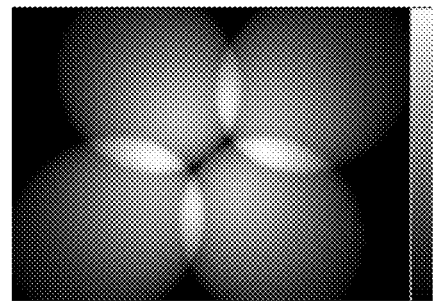

FIGS. 2A-2D are patterns and sampled projection images corresponding to an MPI collimator for a spherical phantom (FIGS. 2A and 2B), and an SAI collimator for a spherical phantom (FIGS. 2C and 2D). FIG. 2A is a pattern for an MPI collimator and FIG. 2B is a sampled projection image generated using an 11-pinhole MPI collimator for a spherical phantom with FOV of 20 cm. FIG. 2C is a pattern for an SAI collimator and FIG. 2D is a sampled projection imaged generated using a 4-pinhole SAI collimator for a spherical phantom with FOV of 5 cm.

Figure 3A:
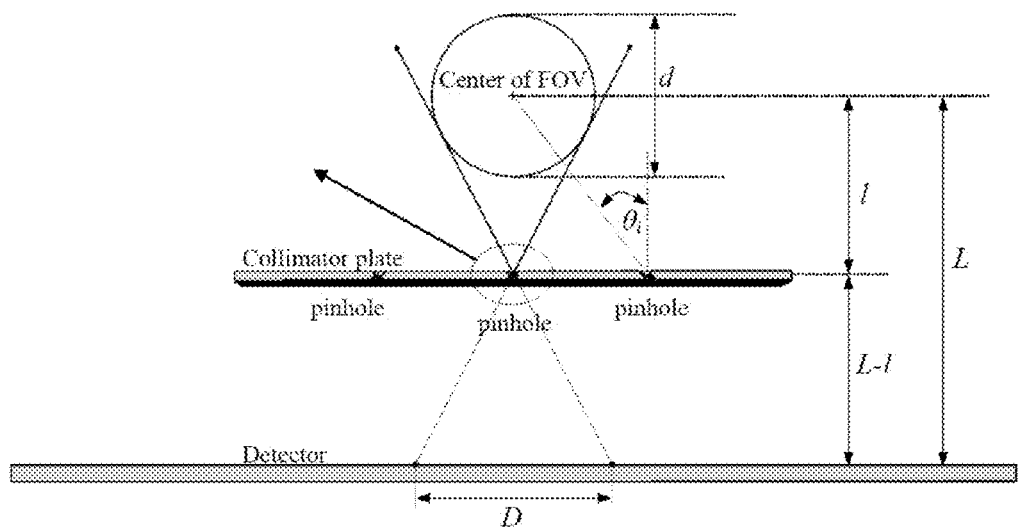
FIGS. 3A and 3B are schematic diagrams showing MPH imaging geometry to describe collimator length, FOV or CFOV.
Figure 3B:
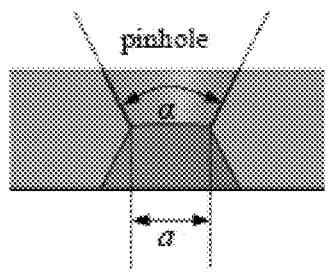

FIGS. 3A and 3B are schematic diagrams showing MPH imaging geometry to describe collimator length, FOV or CFOV.

The maximum $S_n$ was achieved when n=11 and n=4 for MPI and SAI, respectively. The optimum collimator lengths were 14.5 cm and 20.8 cm for MPI and SAI respectively, within the system constraints. The aperture sizes and acceptance angles were $a_{MPI}$=3.42 mm/$\alpha_{MPI}$=54.1° and $a_{SAI}$=0.93 mm/$\alpha_{SAI}$=60°, respectively. The adaptive MPH SPECT collimator design is summarized in Table I.

TABLE I

Summary of MPH design parameters

| Design Parameters | Symbol | MPI | SAI |
|---|---|---|---|
| Pinhole acceptance angle (°) | α | 54.1 | 60 |
| Collimator-to-CFOV distance (cm) | l | 22 | 5 |
| Collimator length (cm) | L-l | 14.5 | 20.8 |
| Detector-to-CFOV distance (cm) | L | 36.5 | 25.8 |
| Number of pinholes | n | 11 | 4 |
| Intrinsic resolution (mm) | $R_i$ | 3.2 | 3.2 |
| Magnification | m | 0.66 | 4.16 |
| Physical aperture size (mm) | a | 3.42 | 0.93 |
| Geometric resolution with penetration | $R_{g,p}$ | 8.85 | 1.29 |
| FOV (mm) | d | 200 | 50 |
| System resolution (mm) | $R_t$ | 10.1 | 1.5 |
| Total sensitivity (%) | $S_n$ | 0.014 | 0.009 |

Figure 4A:
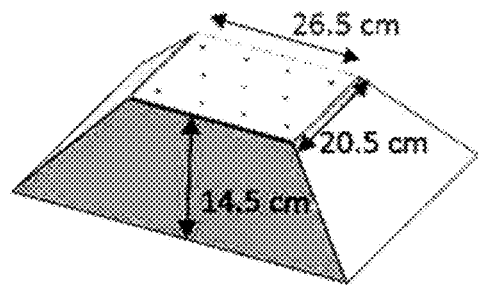
FIGS. 4A and 4B are schematic diagrams showing an MPH collimator for MPI mode (FIG. 4A), and for SAI mode (FIG. 4B).
Figure 4B:
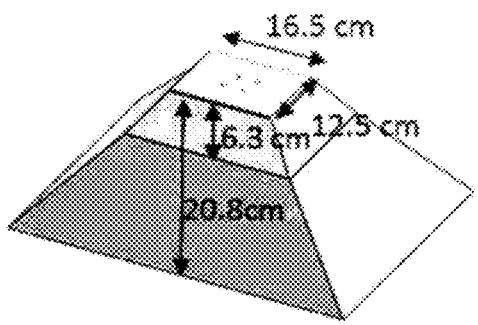

The aperture plate is made of lead with thickness of 6 mm while the aperture insert is made of tungsten. The proposed lead MPH collimator is composed of two parts. FIGS. 4A and 4B are schematic diagrams showing an MPH collimator for MPI mode (FIG. 4A), and for SAI mode (FIG. 4B). One is the base cone with a height of 14.5 cm and another one is an auxiliary cone with a height of 6.3 cm. The base cone can be used solely to perform MPI, and the auxiliary cone can be assembled with the base cone to achieve collimator length of 20.8 cm to perform SAI.

Figure 5:
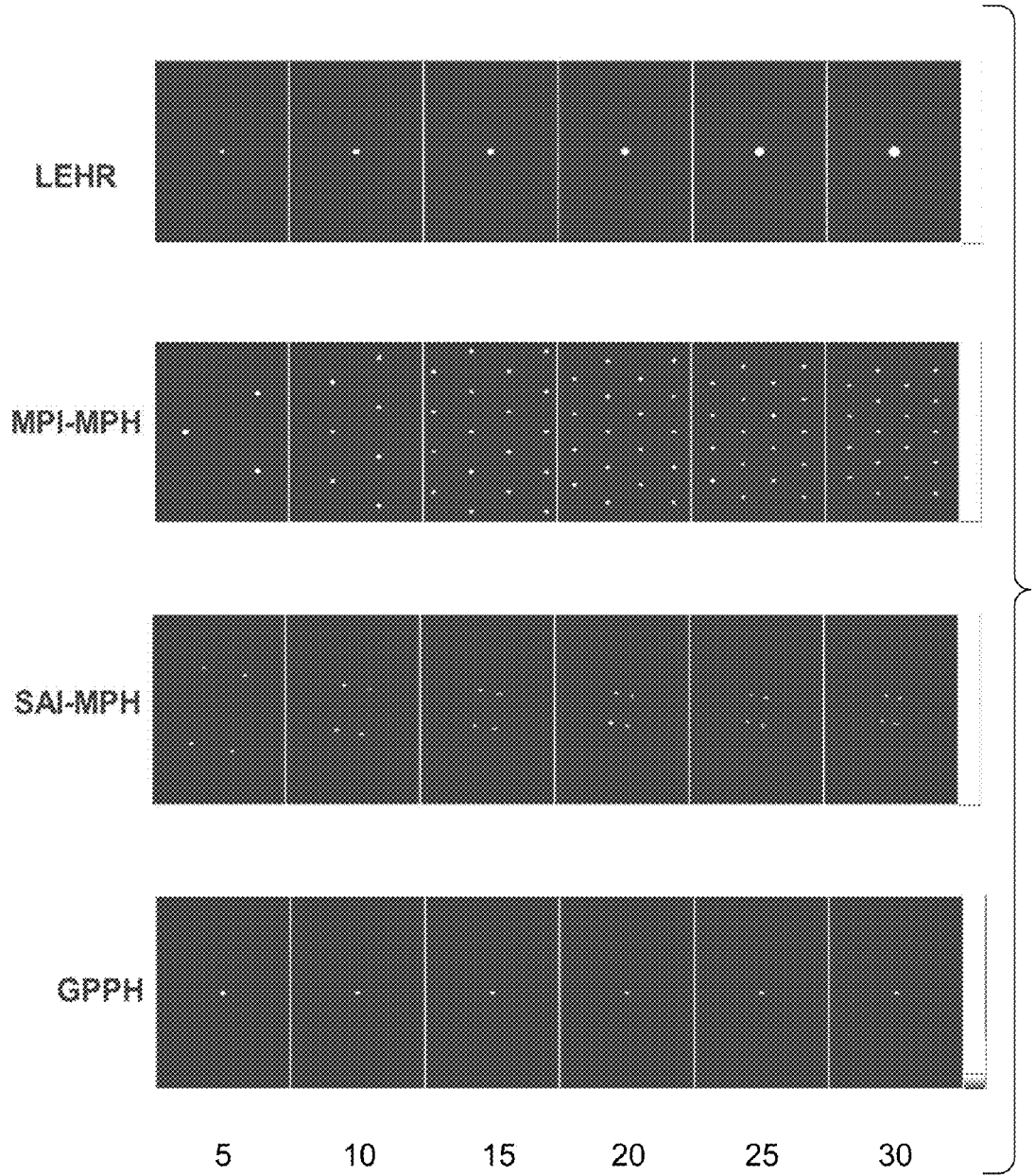
FIG. 5 is a diagram showing point source projection data for different collimators with different imaging distances.

FIG. 5 is a diagram showing simulated point source projection data for different collimators with different imaging distances.

Figure 6A:
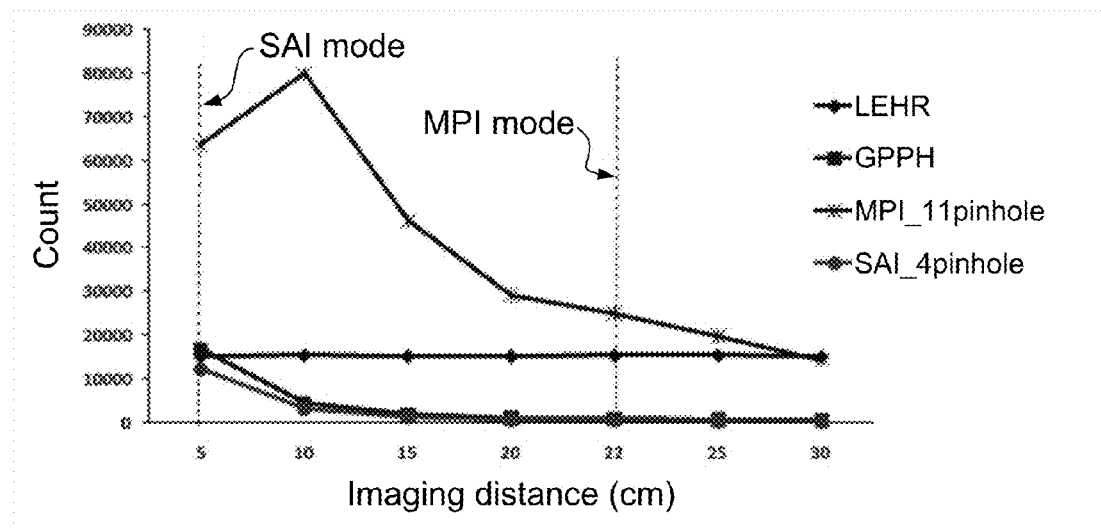
FIGS. 6A and 6B are graphs showing detected counts plotted as a function of imaging distance for different collimators (FIG. 6A), and FWHM plotted as a function of imaging distance for different collimators (FIG. 6B).
Figure 6B:
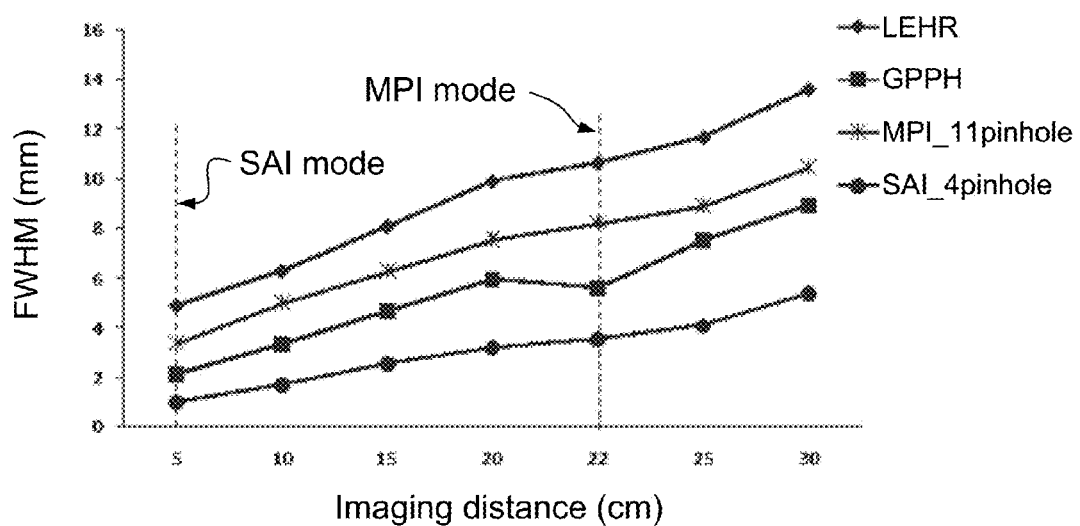

The corresponding quantitative analysis of detection efficiency and resolution was shown in FIGS. 6A and 6B. FIGS. 6A and 6B are graphs showing detected counts plotted as a function of imaging distance for different collimators (FIG. 6A), and FWHM plotted as a function of imaging distance for different collimators (FIG. 6B). The FWHM were 8.25 mm and 1.05 mm for the MPI-MPH and SAI-MPH modes when imaging distance were 22 cm and 5 cm, respectively, showing ~22.9% and ~78.7% improvement as compared to LEHR. The FHWM improvement was ~51.4% for SAI-MPH as compared to GPPH (FIG. 6B). The detection efficiency improvement was ~60.7% as compared to LEHR for the MPI-MPH (FIG. 6A).

CONCLUSION

In the given non-limiting examples, the optimized MPH design for MPI and SAI based on the same clinical SPECT scanner was described and the imaging performance of the new collimator as compared to the traditional LEHR and GPPH collimator was evaluated. Simulation results showed that spatial resolution and detection efficiency improved for ~22.9% and ~60.7% for MPI-MPH as compared to LEHR, respectively. The resolution improvement was ~78.7% and ~51.4% for SAI-MPH as compared to LEHR and GPPH, respectively. The described collimator has the potential to further improve the imaging performance as compared to previous designs. It provides a significant improvement in resolution and detection efficiency trade-off as compared to current MPI using LEHR with extra capability for SAI. This adaptive MPH collimator design provides an economic and novel gateway for bridging clinical and preclinical applications.

It will be understood that many additional changes in the details, materials, steps and arrangement of parts, which have been herein described and illustrated to explain the nature of the subject matter, may be made by those skilled in the art within the principle and scope of the invention as expressed in the appended claims.

What is claimed is:

1. A method for forming a multi-pinhole collimator, the method comprising:
   calculating a projection size (D) for different pinhole numbers (n) for a predetermined field-of-view (FOV) (d) by arranging a plurality of projections into a pattern;
   configuring the pattern to utilize a whole detector with maximized packing density, minimum truncation to provide a projection overlap below a predetermined limit;
   modifying a number of pinholes to calculate a collimator length;
   calculating an acceptance angle and aperture size;
   adding sensitivities for individual pinholes to obtain a total sensitivity for a given pinhole number;
   selecting an optimized multi-pinhole configuration by maximizing the total sensitivity for a predetermined target resolution ($R_t$) and field-of-view (FOV) (d); and
   producing the multi-pinhole collimator comprising an aperture plate having a plurality of pinholes formed therein and having a pinhole configuration corresponding to the selected optimized multi-pinhole configuration.

2. The method as described in claim 1, further comprising:
   modifying the number of pinholes to calculate the associated collimator length ($L_n$–l) according to $$L_n - l = \frac{D_n}{d}\sqrt{l^2 - \frac{d^2}{4}}, n = 1, 2, 3$$

where:
$L_n$–L is the collimator length;
$D_N$ is the projection size,
d is the field-of-view, and
L is the collimator-to-center of FOV distance;
calculating an acceptance angle ($\alpha_N$) and aperture size ($\alpha_N$) according to:

$$\alpha_n = 2\sin^{-1}(d/2l) \text{ and}$$

$$a_n = \sqrt{R_t^2 - R_i^2 \frac{l^2}{(L_n - l)^2}} \frac{L_n - l}{L_n} - \frac{\ln 2}{\mu}\tan\frac{\alpha_n}{2};$$

and
pursuing an optimized multi-pinhole configuration by maximizing the total sensitivity according to:

$$S_n = \sum_{i=1}^{n} S_i$$

$$= \sum_{i=1}^{n} \frac{a_n^2 + \frac{2}{\mu}a_n\tan\frac{\alpha_n}{2} + \frac{2}{\mu^2}\tan^2\frac{\alpha_n}{2}}{16l^2}\sin^3\theta_i,$$

where
$R_T$ is an intrinsic resolution, and
$R_t$ is a system resolution.

3. The method as described in claim 1, further comprising:
   modifying the number of pinholes to calculate the associated collimator length ($L_n$–l) according to $$L_n - l = \frac{D_n}{d}\sqrt{l^2 - \frac{d^2}{4}}, n = 1, 2, 3$$

where:
$L_n$–l is the collimator length;
$D_n$ is the projection size,
d is the field-of-view, and
l is the collimator-to-center of FOV distance;
calculating an acceptance angle ($\alpha_n$) and aperture size ($\alpha_n$) according to:

$$\alpha_n = 2\sin^{-1}(d/2l) \text{ and}$$

$$a_n = \sqrt{R_t^2 - R_i^2 \frac{l^2}{(L_n - l)^2}} \frac{L_n - l}{L_n} - \frac{\ln 2}{\mu}\tan\frac{\alpha_n}{2};$$

and pursuing an optimized multi-pinhole configuration by maximizing the total sensitivity according to:

$$S_n = \sum_{i=1}^{n} S_i$$

$$= \sum_{i=1}^{n} \frac{a_n^2 + \frac{2}{\mu} a_n \tan\frac{\alpha_n}{2} + \frac{2}{\mu^2}\tan^2\frac{\alpha_n}{2}}{16l^2} \sin^3\theta_i,$$

where $R_t$ is an intrinsic resolution, and $R_t$ is a system resolution.

4. The method as described in claim 1, further comprising:

focusing all of the pinholes to center of the FOV.

5. A multi-pinhole collimator comprising:

a plurality of pinholes, the pinholes having a calculated projection size (D) for different pinhole numbers (n) for a predetermined field-of-view (FOV) (d) with the pinholes arranged to project into a pattern;

the pattern of the pinholes configured to utilize a whole detector with maximized packing density, minimum truncation to provide a projection overlap below a predetermined limit, and having a number of pinholes selected in accordance with a calculation of a collimator length, acceptance angle and aperture size, with sensitivities for individual pinholes added to obtain a total sensitivity for a given pinhole number; and the multi-pinhole configuration optimized by maximizing the total sensitivity for a predetermined target resolution ($R_t$) and field-of-view (FOV) (d).

6. The multi-pinhole collimator of claim 5, further comprising:

the number of pinholes modified to calculate the associated collimator length ($L_n$–l) according to $$L_n - l = \frac{D_n}{d}\sqrt{l^2 - \frac{d^2}{4}}, n = 1, 2, 3$$

where:

$L_n$–l is the collimator length;

$D_n$ is the projection size, d is the field-of-view, and l is the collimator-to-center of FOV distance.

7. The multi-pinhole collimator of claim 6, further comprising:

the pinholes having an acceptance angle ($\alpha_n$) and aperture size ($\alpha_n$) calculated according to:

$$\alpha_n = 2\sin^{-1}(d/2l) \text{ and}$$

$$a_n = \sqrt{R_t^2 - R_i^2 \frac{l^2}{(L_n - l)^2}} \frac{L_n - l}{L_n} - \frac{\ln 2}{\mu}\tan\frac{\alpha_n}{2};$$

and the collimator having an optimized multi-pinhole configuration obtained by maximizing the total sensitivity according to:

$$S_n = \sum_{i=1}^{n} S_i$$

$$= \sum_{i=1}^{n} \frac{a_n^2 + \frac{2}{\mu} a_n \tan\frac{\alpha_n}{2} + \frac{2}{\mu^2}\tan^2\frac{\alpha_n}{2}}{16l^2} \sin^3\theta_i,$$

where $R_t$ is an intrinsic resolution, and $R_t$ is a system resolution the pinholes having an acceptance angle ($\alpha_n$) and aperture size ($\alpha_n$) calculated according to:

$$\alpha_n = 2\sin^{-1}(d/2l) \text{ and}$$

$$a_n = \sqrt{R_t^2 - R_i^2 \frac{l^2}{(L_n - l)^2}} \frac{L_n - l}{L_n} - \frac{\ln 2}{\mu}\tan\frac{\alpha_n}{2};$$

and the collimator having an optimized multi-pinhole configuration obtained by maximizing the total sensitivity according to:

$$S_n = \sum_{i=1}^{n} S_i$$

$$= \sum_{i=1}^{n} \frac{a_n^2 + \frac{2}{\mu} a_n \tan\frac{\alpha_n}{2} + \frac{2}{\mu^2}\tan^2\frac{\alpha_n}{2}}{16l^2} \sin^3\theta_i,$$

where $R_t$ is an intrinsic resolution, and $R_t$ is a system resolution.

8. The multi-pinhole collimator of claim 5, further comprising:

all of the pinholes having a focus to a center of the FOV.

* * * * *